United States Patent
Ueno et al.

(10) Patent No.: US 8,015,690 B2
(45) Date of Patent: Sep. 13, 2011

(54) SHIELD METHOD FOR ELECTRONIC COMPONENT ENCLOSURE AND SHIELD MATERIAL

(75) Inventors: Yoshikazu Ueno, Ibaraki-ken (JP); Haruhiko Kondo, Tokyo (JP); Harumi Kano, Tokyo (JP); Mitsuru Obo, Ibaraki-ken (JP); Akito Yoshii, Niigata-ken (JP); Masahiro Kitamura, Niigata-ken (JP); Hidenori Iida, Niigata-ken (JP); Shin Teraki, Niigata-ken (JP)

(73) Assignees: SMK Corporation, Tokyo (JP); Namics Corporation, Niigata-ken (JP)

( * ) Notice: Subject to any disclaimer, the term of this patent is extended or adjusted under 35 U.S.C. 154(b) by 305 days.

(21) Appl. No.: 12/283,711

(22) Filed: Sep. 15, 2008

(65) Prior Publication Data

US 2009/0223711 A1  Sep. 10, 2009

(30) Foreign Application Priority Data

Mar. 6, 2008 (JP) .................................. 2008-056309

(51) Int. Cl.
*H05K 9/00* (2006.01)
*H01S 4/00* (2006.01)

(52) U.S. Cl. .................. 29/592.1; 174/394; 174/386
(58) Field of Classification Search .................. 174/388, 174/394, 386; 361/816; 29/592.1
See application file for complete search history.

(56) References Cited

FOREIGN PATENT DOCUMENTS

| JP | 2005-276624 | 10/2005 |
|---|---|---|
| JP | 2006-294444 | 10/2006 |
| JP | 2007-036812 | 2/2007 |

*Primary Examiner* — Hung Ngo
(74) *Attorney, Agent, or Firm* — Jordan and Hamburg LLP

(57) ABSTRACT

The objective of the present invention is to provide a shield method and shield material enabling to hold a flexibility degree with an enclosure shape and to make electronic component enclosures small and thin types. The shield method for electronic component enclosures in the present invention comprises a process in which a conductive layer is formed at a basic sheet and a shield sheet forming a non-hardening adhesive layer at the counter face to the basic layer is punched out to fit in individual electronic component enclosures for forming the shield materials, a process in which the shield material is attached to said electronic component enclosure, and a process in which a conductive adhesive is formed between a ground electrode set at said electronic component enclosure and the conductive layer to connect electrically.

5 Claims, 4 Drawing Sheets

Fig.1
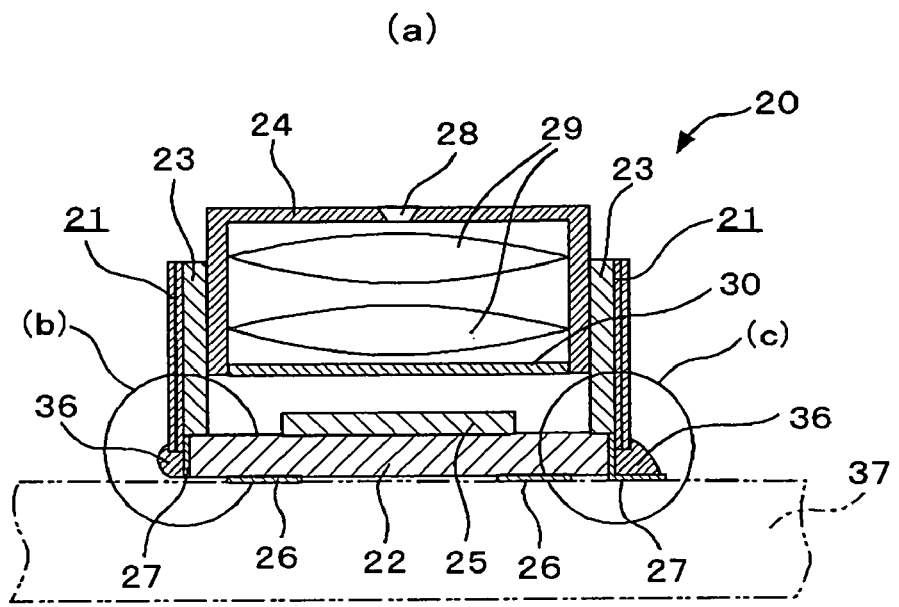
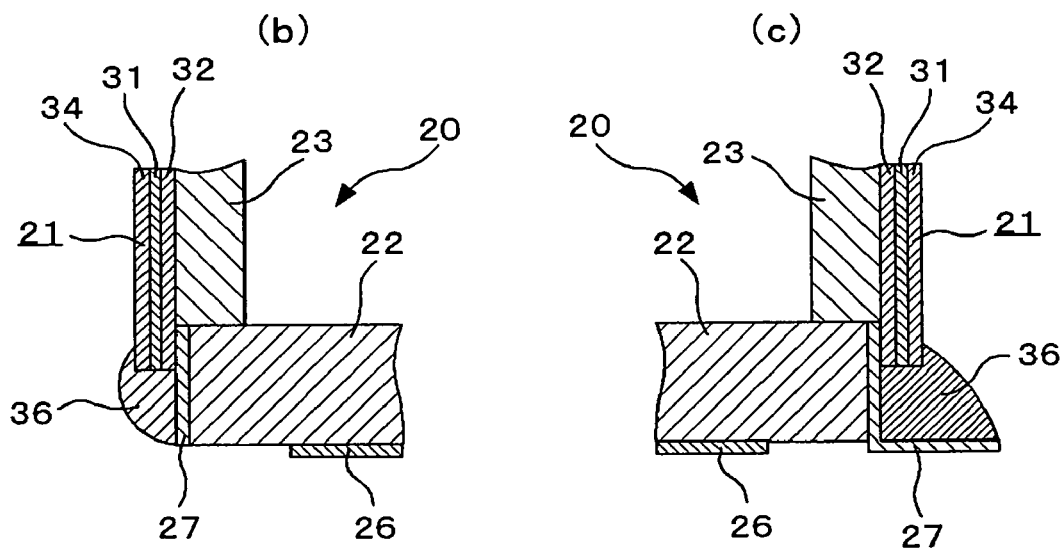
Fig.2
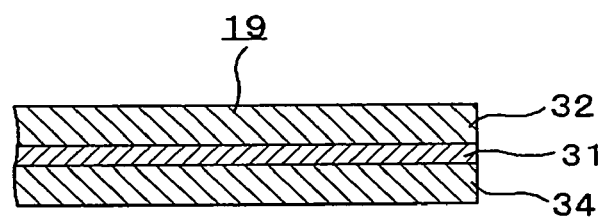

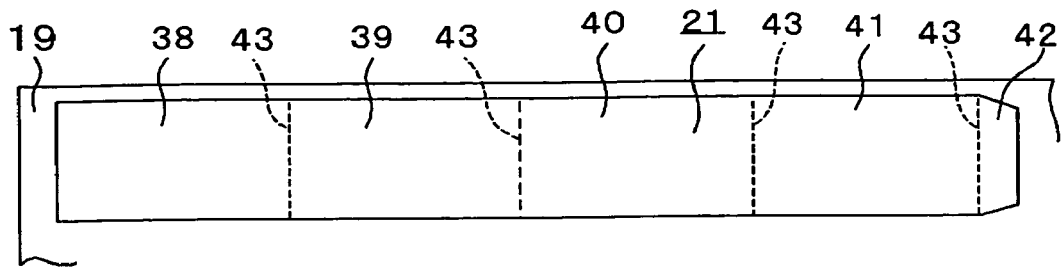
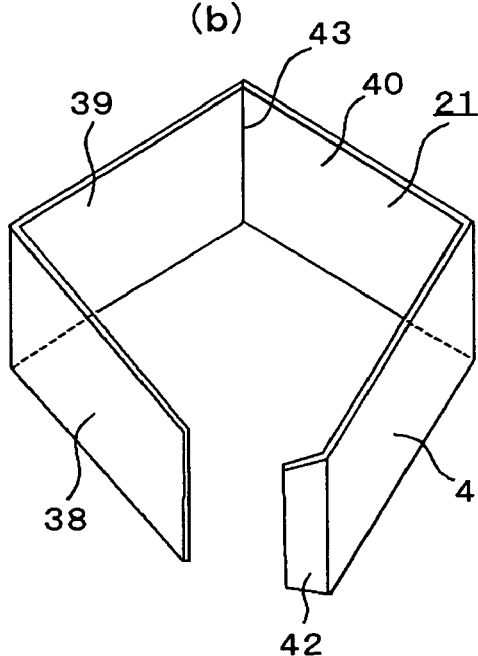
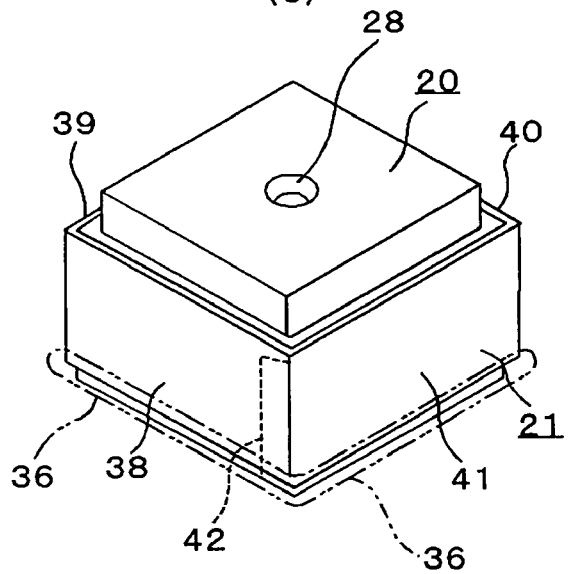
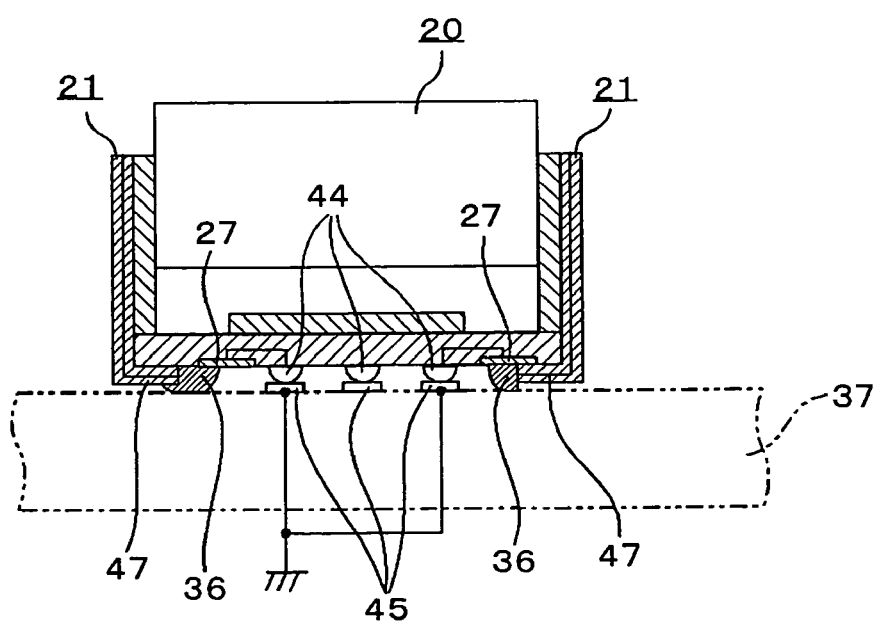

Fig.7
(a)
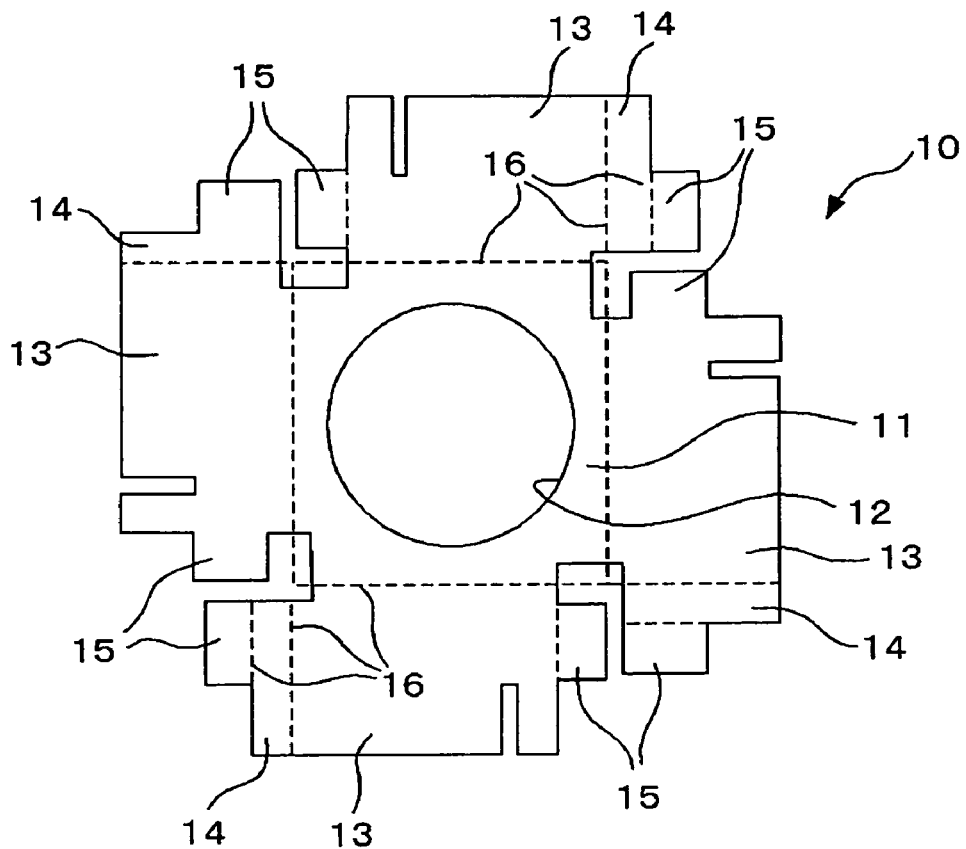
(b)
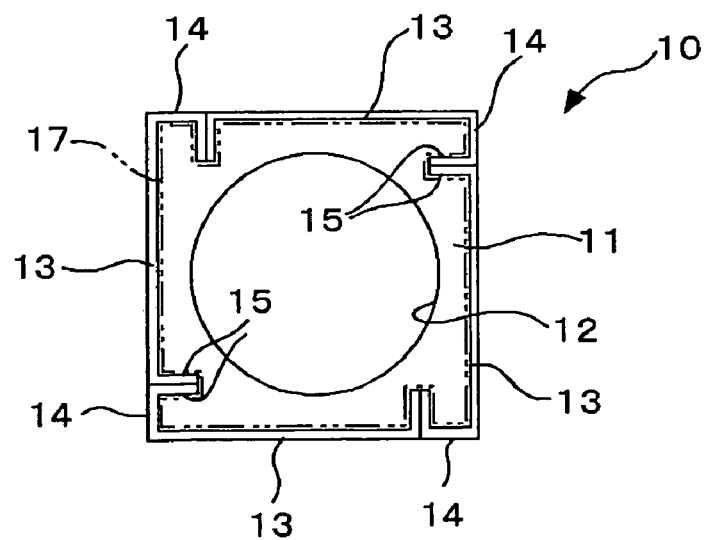

SHIELD METHOD FOR ELECTRONIC COMPONENT ENCLOSURE AND SHIELD MATERIAL

BACKGROUND OF THE INVENTION

1. Field of the Invention

The present invention relates to a shield method and shield material for electronic component enclosures to prevent mixing noises to electronic components or transmitting noises from electronic components in electronic components receiving and transmitting by high frequencies, which are small types of about several millimeters like camera modules mounted in cell phones.

2. Description of the Prior Art

As for shielding electronic components, known conventional methods are the first method covering electronic component enclosures by shield cases of sheet metals and the second one resin-coating the surfaces of the enclosures.

Methods covering electronic component enclosures by shield cases of said sheet metals include a method in which an electrically-conductive thin metal plate like phosphor bronze is processed to be narrowed down and be formed like a case, and another method in which a thin metal plate is punched out by pressing and is then formed by clinch-process (Patent reference 1).

The method in which the thin metal plate is punched out by pressing and then formed by clinch-process is a shield type in which a top panel 11, a passage opening 12, a main lateral plate 13 and others are punched out to become designated shapes and a shield case 10 covers an electronic component 17 of square and other shapes from the head for shielding, as shown in FIGS. 7(a) and (b). Moreover, specifically, in the top panel 11, the passage opening 12 for the head to project above the electronic component 17, the main lateral plate 13, a sub-lateral plate 14 and a folded piece 15 of the four sides of the top panel 11 are punched by press. Next, a fold line 16 is processed with bending to make a cubic shield case and this covers from the top of the electronic component 17 to obtain a shield effect.

Besides it, similar shield cases are described in the patent references 2 and 3 and others.

[Patent reference 1] Japanese Provisional Publication No. 2005-276624

[Patent reference 2] Japanese Provisional publication No. 2006-294444

[Patent reference 3] Japanese Provisional publication No. 2007-36812

In methods to form cases by drawing compound of conductive thin metal plates, because one metal plate is processed, although its shield effect is superior, the plate thickness is limited up to 0.1 mm and the shape at the drawing compound must be rounded, leading to become a large size overall. In addition, its deep drawing compound is so difficult that it is limited for shapes of small type electronic components.

In methods in which metal plates are punched out and clinched to form as shown in the patent references 1-3, the plate thickness is limited similarly to said drawing compound and the punching-out and clinching cannot be done smoothly. Moreover, it is necessary for the folding part to electrically connect by overlap space such as folded leaf in order to improve the shield effect, which makes it difficult to produce a small type.

In methods in which the surface of the enclosure is coated by resin, it is possible to make small and thin types because the external surface of the mold enclosure is coated by resin. When the enclosure consists of multiple components, it is necessary to conduct resin-coating before assembly and pass electricity at the connection sites among components, which leads to higher cost.

The objective of the present invention is to provide a shield method and shield material for enclosures of electronic components, which enables to make enclosure shapes flexible and make the components small and thin types.

SUMMARY OF THE INVENTION

The shield method of enclosures of electronic components in the present invention is characterized by comprising a process in which a conductive layer is formed at a basic sheet and a shield sheet forming a non-hardening adhesive layer on the counter face to the basic sheet is cut to fit in individual electronic component enclosures, a process in which the shield material is attached to said enclosure, and a process in which a conductive adhesive is formed between a ground electrode set at said enclosure and said conductive layer of said shield material.

The shield sheet in the present invention is characterized in that the conductive layer is formed in the basic sheet and the shield sheet is formed by forming non-hardening adhesive layer for attaching to the electronic component enclosure on the counter face to the basic sheet in the conductive layer and the shield sheet is cut to fit in the enclosure.

The present invention as defined in claim 1 is the shield method comprising the process in which the conductive layer is formed in the basic sheet and the shield sheet forming the non-hardening adhesive layer on the counter face to the basic sheet in the conductive layer is cut to fit in the enclosures to form the shield material and the process in which the shield material is attached to said electronic component enclosures. Thus, following effects are present:

(1) The shield material enables to reduce the thickness to a fraction and up to one several tenth of conventional sheet metal's and comply with sharp or round shapes, consequently complying with small types of electronic component shapes.

(2) Because it is a shield material, it facilitates to comply with shapes after assembling electronic components.

(3) The shield material can be handled so simply that the workability is superior and a cheaper price can be provided.

The present invention as defined in claim 2 is the shield method for electronic component enclosures, comprising a process in which the conductive layer is formed in the basic sheet and the shield sheet forming the non-hardening adhesive layer on the counter face to the basic sheet in the conductive layer is cut to fit in the enclosures to form the shield materials, a process in which the shield materials are attached to said electronic component enclosures, and a process in which the conductive adhesive is formed between the ground electrode set at said enclosure and the conductive layer of said shield material to connect electrically. Consequently, an electrical connection can be done surely between the ground electrode set at the enclosure and the conductive layer of the shield material.

The present invention as defined in claim 3 is the shield method for electronic component enclosures, in which the non-hardening adhesive in the process to form the shield materials is formed by transcribing the non-hardening adhesive layer with a pre-coated cover-film being possible to be peeled off to the conductive layer. Consequently, it is easy to manage the thickness of the non-hardening adhesive layer and adhesive faces.

The present invention as defined in claim 4 is the shield method, in which the non-hardening adhesive layer in the process to form the shield materials is formed in such a manner that the non-hardening adhesive layer with the peel-off possible cover-film is dried and solidified like a film of 5-30 μm in thickness in advance by heat hardening resin with a low minimum melt-viscosity and the adhesive layer is transcribed with lamination to the conductive layer and the cover film is peeled off after the transcription. Consequently, the thinner non-hardening adhesive layer can be laminated to the conductive layer. Because the cover-film is peeled off after the transcription, adhesion of dusts and oils to the adhesive faces can be prevented so more surely that the reliability of the adhesion to the electronic component enclosure can be increased.

The present invention as defined as claim 5 is the shield method for electronic component enclosures in which the shield material is winded at the outer circumference of an electronic component enclosure in the adhesion process. Consequently, the work to attach the shield materials to electronic component enclosures can be done simply and surely.

The present invention as defined in claim 6 is the shield method for electronic component enclosures in which the shield materials cut from the shield sheet to fit in an electronic component enclosures are processed with bending to fit in the shapes of the enclosures and the shield materials are attached to the outer circumferences of the enclosures in the adhesion process. Consequently, the process to attach the shield material to the outer circumference of electronic component enclosure can comply with mass production by mechanization.

The present invention as defined in claim 7 is the shield material in which the conductive layer is formed in the basic sheet and the non-hardening adhesive layer to attach to electronic component enclosures is formed on the counter face to the basic sheet in the conductive layer. Consequently, the thickness of the shield material can be reduced to a fraction and up to one several tenth of conventional sheet metal's. The shield material can comply with sharp or round shapes and thus comply with shapes of smaller types of electronic components. The workability to attach the shield materials to electronic component enclosures is superior and cheaper prices can be provided.

The present invention as defined in claim 8 is the shield material in which the conductive layer is formed in the basic sheet and the non-hardening adhesive layer to attach to electronic component enclosures is formed on the counter face to the basic sheet in the conductive layer to form the shield sheet, which is cut to fit in each enclosure. Consequently, the non-hardening adhesive layer can be formed at the conductive layer thinly and surely.

The present invention as defined in claim 9 is the shield material in which the basic sheet comprises a synthetic resin film of 5-30 μm in thickness with heat resistance and electrical insulation properties. Consequently, the shield materials enabling to produce smaller and thinner types of electronic components can be obtained.

The present invention as defined in claim 10 is the shield material in which as for the conductive layer, a conductive paste with silver particulates is printed by screen-printing or other methods or applied and a silver membrane of 1-10 μm in thickness is formed by calcining. Consequently, the shield materials which have superior epidermic effects can be obtained. The shield materials can be used far more simply than silver coating or silver foil and favorable shield properties can be also obtained by the shield materials.

The present invention as defined in claim 11 is the shield material in which as for the non-hardening adhesive layer, it is dried and solidified like a thin film of 5-30 μm by heat hardening resin with a low minimum melt-viscosity. Consequently, the adhesion of the non-hardening adhesive layer to electronic component enclosures can be done more surely.

BRIEF DESCRIPTION OF THE DRAWINGS

FIG. 1(a) shows a cross section view of Embodiment 1 of the shield material and the shield method for electronic component enclosures using the shield material in the present invention. FIG. 1(b) shows an enlarged cross section view of (b) part in FIG. 1(a) and FIG. 1(c) shows an enlarged cross section view of (c) part in FIG. 1(a).

FIG. 2 shows an enlarged cross section view of a shield sheet 19 in the present invention.

FIG. 3(a) shows a plain view of a punch-out example of a shield material 21 of winding type from the shield sheet 19 in the present invention.

FIG. 3(b) shows an oblique view after bending process.

FIG. 3(c) shows an oblique view after winding.

FIG. 4 shows a cross section view of Embodiment 2 of the shield material and the shield method for electronic component enclosures using the shield material.

FIG. 7(a) shows a plain view of the shield case 10 punched out by conventional sheet metal.

FIG. 7(b) shows a basal view of a condition that the shield case was covered by the electronic component 17.

DESCRIPTION OF THE PREFERRED EMBODIMENT

Figure 5:
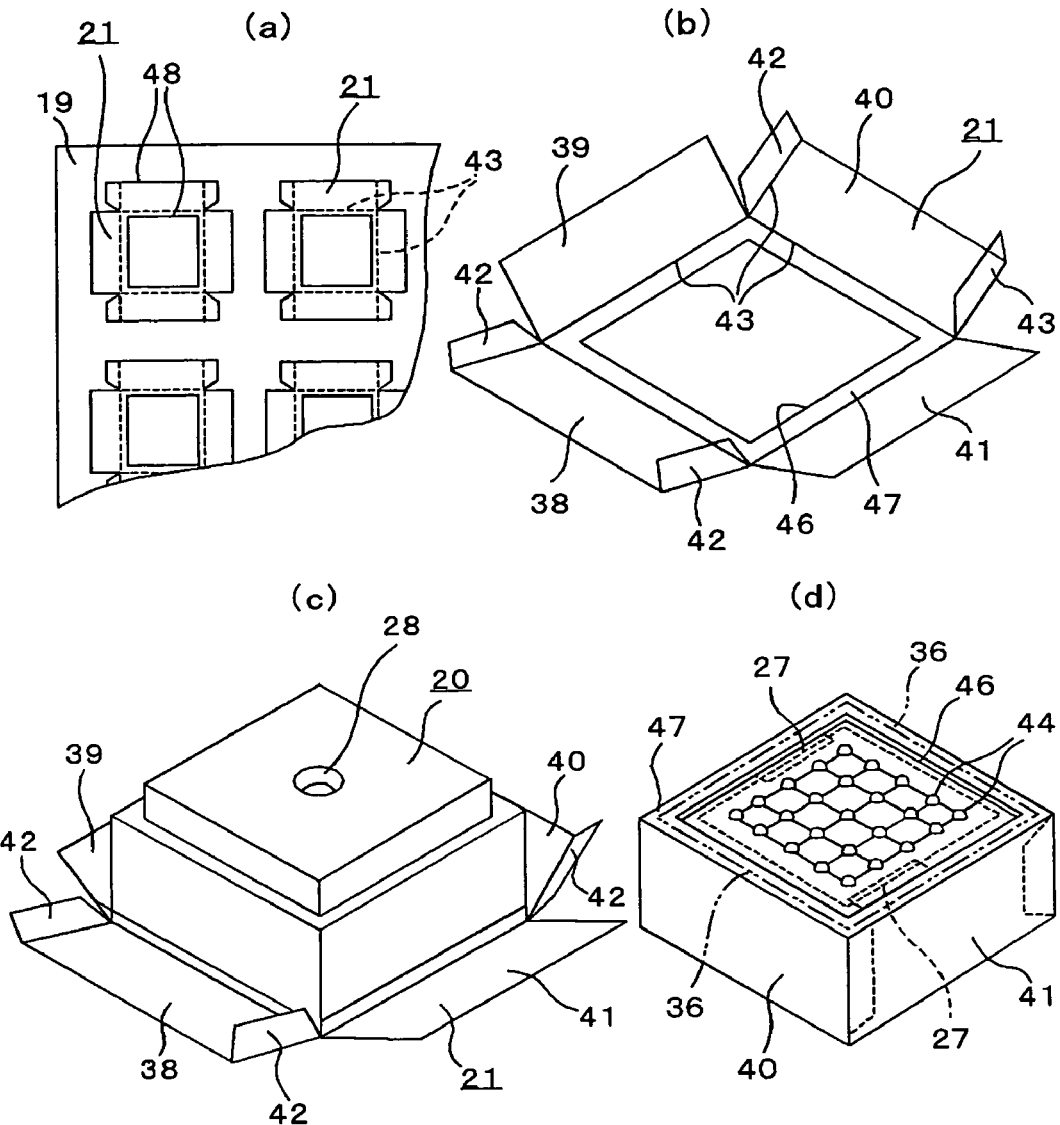
FIG. 5(a) shows a plain view of a punch-out example of the shield material 21 of bending process type from the shield sheet 19 in the present invention.
FIG. 5(b) shows an oblique view of bending-processed condition of the shield material 21.
FIG. 5(c) shows an oblique view of a condition that an electronic component enclosure 20 was set at the shield material processed with bending.
FIG. 5(d) shows an oblique view seen from the bottom face after the shield material 21 was attached to the electronic component enclosure 20.

The shield method for electronic component enclosures in the present invention comprises a process in which a conductive layer is formed at the basic sheet and the shield sheet forming a non-hardening adhesive layer on the counter face to the basic sheet at the conductive layer is punched out or cut to fit in electronic component enclosures to form the shield materials, a process in which the shield material is attached to said electronic component enclosure, and a process in which a conductive adhesive is formed between a ground electrode set at said electronic component enclosure and the conductive layer of said shield material to connect electrically.

The process to attach the shield materials to electronic component enclosures employs a method in which the shield material is wound at the outer circumference of electronic component enclosure, a method in which the shield material cut from the shield sheet to fit in an electronic component enclosure is processed to fit in the shape of the electronic component enclosure and the processed material is then attached to the outer circumference of the enclosure and others.

The shield material used in the present invention forms a conductive layer at the basic sheet and forms a non-hardening adhesive layer on the counter face to the basic layer to attach to electronic component enclosures for configuring the shield sheet. And the shield sheet is then punched out to fit in the electronic component enclosure to form.

To form the non-hardening adhesive layer at the conductive layer, the conductive layer is formed at a peel-off possible cover film and the non-hardening adhesive layer is then transcribed with a lamination to the conductive layer.

Embodiment 1

As shown in FIGS. 1-3, 20 is a small type electronic component enclosure and the shield material 21 in the present invention is attached to the enclosure 20.

When said enclosure 20 is about several millimeters in size such as camera modules equipped in cell phones, the enclosure 20 comprises a square basal plate 22, a seat 23 stood at the four sides of the basal plate 22, and a lens barrel 24 with a top panel mounted at the inside of the seat 23.

A sensor 25 is set on the upper face of the basal plate 22, a ground electrode 27 at the outer circumferential margin and a land pattern for connection 26 on the lower face.

A light-enter opening 28 is set at the center of the top panel of the lens barrel 24 and a lens 29 is mounted at the inside. An infra-red ray filter 30 is set at the bottom.

The shield material 21 formed by punch-out or cut as shown in FIG. 2 is attached to the outer face of the seat 23 in the electronic component enclosure 20 which was configured as such.

In the shield sheet 19 configuring the shield material 21, using a basic sheet 34 with an electrical insulation of 5-30 μ in thickness, a favorable conductive layer 31 with shield properties is formed with 1-10 μm in thickness in the basic sheet 34 and a non-hardening adhesive layer 32 with an insulation of 5-30 μm in thickness is formed at the side of the conductive layer 31 for preventing the sulfuration of silver in the conductive layer 31 and for adhesion to the electronic component enclosure 20.

Said basic sheet 34 employs synthetic resin films with a heat resistance tolerating a reflow of 260° C. or higher and an electric insulation, such as those from epoxy, modified polyphenylene ether, polyimide, polyphenylene sulfide, and others. More specifically, a synthetic resin film that composition substances of oligophenylene ether and elastomer are hardened with 5-30 μm in thickness like a film is used.

In said conductive layer 31, to obtain favorable shield properties, it is preferable that the silver conductive layer is sintered with 1-10 μm. For instance, silver particulates separated out by a reaction as defined in Japanese Provisional Publication NO. 2006-183072 are precipitated and the precipitated layer containing 40-90% by weight of the silver particulates is used as a conductive paste. The conductive paste is printed in said basic sheet 34 by screen printing or other methods or applied to the sheet 34 and the silver membrane as said conductive layer 31 is formed by calcination at 60~200° C.

The method to form the conductive layer 31 by sinter of such silver particulates or silver nanopowder is far simpler than the use of silver coating or silver foil and also enables to obtain favorable shield properties.

In said non-hardening adhesive layer 32, heat hardening resins with a low minimum melt-viscosity which can be formed like a thin film of 5-30 μm in thickness are suitable. For instance, composition substances of oligophenylene ether and elastomer or epoxy resin composition substances which are dried and solidified to become non-hardening conditions are used. To form the non-hardening adhesive layer 32 with non-hardening conditions at the conductive layer 31, the non-hardening adhesive layer 32 is applied to the peel-off possible cover film in advance and the non-hardening adhesive layer 32 is transcribed with a lamination to the conductive layer 31. Then, the cover film is peeled off for the configuration. Besides the laminated transcription using peel-off possible cover films, the non-hardening adhesive layer 32 can be applied directly to the conductive layer without use of cover film.

The shield sheet 19 configured as the above is formed in advance in a sufficient size from which several pieces of the shield material 21 can be obtained and as shown in FIG. 3(a), its press-punching out or cutting is conducted to fit in individual shapes of electronic component enclosure 20.

In addition, in forming the shield material 21, if the viscosity of the non-hardening adhesive layer 32 is absent at an ordinary temperature, the cover film is peeled off from the shield sheet 19 in advance and the punch-out or cut can be then done, or without peeling off the cover film, the punch-out or cut can be conducted immediately before the attachment to the electronic component enclosure 20.

FIGS. 3(a), (b), and (c) show examples that the shield material 21 is attached by winding at the outer circumferential face of the electronic component enclosure 20. To facilitate the winding, one piece of the shield material 21 is configured continuously in the order of a front face 38, a left lateral face 39, a dorsal face 40, a right lateral face 41 and a superposition site 42 and each border site becomes a fold line 43.

In the shield material 21 punched out from one piece of the shield sheet 19 as shown in FIG. 3(a), when necessary, as shown in FIG. 3(b), the side of the non-hardening adhesive layer 32 is made the inside and the fold line 43 is processed with bending and as shown in FIG. 3(c), the material is wound closely on the outer circumferential face of the seat 23 in the electronic component enclosure and attached by pressure or heat. The part in which the right lateral face 41 and front face 38 continue is covered without spaces by the superposition site 42.

At that time, the part in which the conductive layer 31 of the bottom face of the shield material 21 is exposed is lengthened up to the midway point of the ground electrode 27 of the basal plate 22.

As shown in FIG. 1, under this condition, the shield material 21 is attached to the electronic component enclosure 20. Then, the conductive adhesive 36 is applied to the site between the part that the conductive 31 is exposed and the ground electrode 27 and the shield material 21 and ground electrode 27 are connected electrically.

The ground electrode 27 is connected in the following order; the internal wiring of the basal plate 22, the land pattern for connection 26, a grounding wire of a print basal plate 37 and an earth terminal.

In addition, the ground electrode 27 of the basal plate 22 can be formed only at the end face of the basal plate 22 as shown in FIG. 1(b), or it can be formed as lengthening externally with a L letter shape from the end face of the basal plate 22 as shown in FIG. 1(c).

Said conductive adhesive 36 employs a conductive paste which adheres at 100~150° C. and solders melting at 200° C. or higher are also usable.

Embodiment 2

In Embodiment 1, because the ground electrode 27 of the basal plate 22 is formed at the outer circumferential end face, the part that the conductive 31 of the lower end face of the shield material 21 is exposed is formed as lengthening to the midway point of the ground electrode 27 of the basal plate 22 and the shield material 21 is wound at the electronic component enclosure 20 for attachment.

However, it isn't limited to this and when the ground electrode 27 of the basal plate 22 is not formed at the outer circumferential end face of the basal plate 22, the lower end face of the shield material 21 can be lengthened to the lower face of the basal plate 22. The examples are explained, based on FIGS. 4 and 5.

As shown in FIG. 5(a), the shield material 21 from one piece of the shield sheet 19 as shown in FIG. 2 is punched out at a punching line 48 one by one by press or other methods. As shown in FIG. 5(b), the punched out material is processed with bending along the fold line 43. Consequently, a bottom face 47 with a prescribed width is formed around a central pull-out opening 46. The front face 38, left lateral face 39, dorsal face 40 and right lateral face 41 are also formed at the four sides. Moreover, the superposition 42 is formed at both the sides of the front face 38 and dorsal face 40.

As shown in FIG. 5(c), the electronic component enclosure is set on the bottom face 47 of the shield material 21 that the cover film 35 was peeled off. Then, as shown in FIG. 5(d), the material is contacted closely to the outer circumferential face of the seat 23 of the electronic component enclosure 20 and attached by pressure, heat or others. At that time, continuing parts including the front face 38 and left lateral face 39, the left lateral face 39 and dorsal face 40, the dorsal face 40 and right lateral face 41, and the right lateral face 41 and front face 38 are attached without spaces by means of the superposition 42. After attachment of the shield material 21, as shown in FIGS. 5(d) and 4, when the conductive adhesive 36 is applied to the part that the conductive layer 31 is exposed form the end face of the bottom face 47, the ground electrode 27 of the lower face of the basal plate 22 and the conductive layer 31 are connected electrically.

In addition, as shown in FIG. 4, when the end face of the bottom face 47 overlaps with the ground electrode 27 (FIG. 4's right side), the application of only a small amount of the conductive adhesive 36 enables to connect electrically. If the end face of the bottom face 47 doesn't overlap with the ground electrode 27 and exists at a position at which a space is present (FIG. 4's left side), the application of a generous amount of the conductive adhesive 36 enables to connect electrically.

When the electronic component enclosure 20 attached to the shield material 21 is mounted at the print basal plate 37 and heated, a ball grid alley 44 of the lower face of the basal plate 22 melts to be connected with a print wiring part 45 of the print basal plate 37 and the print wiring part 45 is grounded through the wire of the print basal plate 37.

Figure 6:
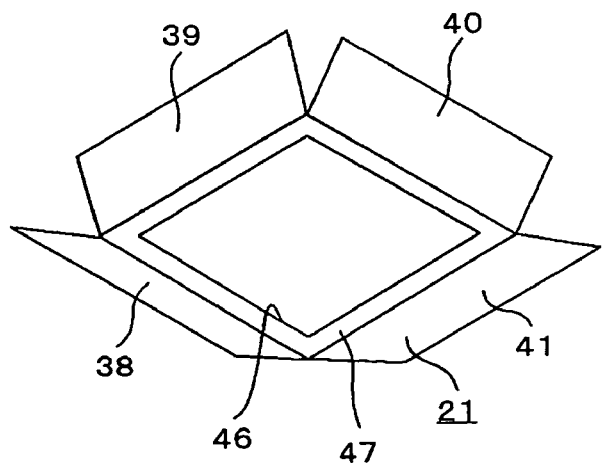
FIG. 6 shows an oblique view of another example of the shield material 21 of bending process type in the present invention.

In addition, when individual end faces themselves in the shield material 21, including the front face 38 and left lateral face 39, the left lateral face 39 and dorsal face 40, the dorsal face 40 and right lateral face 41, and the right lateral face 41 and front face 38, are attached without spaces, as shown in FIG. 6, the superposition 42 can be omitted.

In Embodiment 1, the shield material 21 is wound at the electronic component enclosure 20. In Embodiment 2, the punched out material is processed with bending along the fold line 43. In the present invention, these combinations can be used according to shapes of the electronic component enclosure 20 and purposes of the shield.

In said embodiments, for the non-hardening adhesive layer 32, heat-hardening adhesives which don't attach at ordinary temperatures, but attach and harden by heat are used. However, rubber adhesives which don't attach at ordinary time, but attach by pressure are also usable.

The invention claimed is:

1. A method of shielding an electronic component enclosure, comprising:
    forming a conductive layer on a base sheet;
    forming a non-hardening adhesive layer on a face of said conductive layer facing away from said basic sheet to form a shield sheet;
    cutting the shield sheet to a size suitable to fit the electronic component enclosure in order to form a shield material;
    attaching the shield material to said electronic component enclosure; and
    forming a conductive adhesive between a ground electrode set at said electronic component enclosure and the conductive layer to provide electrical connectivity.

2. A method according to claim 1, wherein said forming of the non-hardening adhesive layer comprises:
    applying the non-hardening adhesive layer applied to a peelably removable cover film;
    transcribing the non-hardening adhesive layer to the conductive layer; and
    peeling off the cover film from the non-hardening adhesive layer transcribed to the conductive layer.

3. A method according to claim 1, wherein said forming of the non-hardening adhesive layer further comprises:
    drying and hardening the non-hardening adhesive layer to form a dried film of 5-30 μm in thickness, said non-hardening adhesive layer comprising a heat-hardening resin with a low minimum melt-viscosity.

4. A method according to claim 1, wherein attaching the shield material to the electronic component enclosure comprises winding the shield material at an outer circumference of the electronic component enclosure; and
    attaching the shield material to an outer circumference of the electronic component enclosure.

5. A method according to claim 1, wherein said attaching comprises:
    processing the shield material from the shield sheet which was cut to fit in the electronic component enclosure, said processing including bending along a shape of the electronic component enclosure; and
    attaching the shield material to an outer circumference of the electronic component enclosure.

* * * * *